(12) United States Patent
Kaija

(10) Patent No.: US 11,659,663 B2
(45) Date of Patent: May 23, 2023

(54) MECHANICAL SUPPORT WITHIN MOULDED CHIP PACKAGE

(71) Applicant: MURATA MANUFACTURING CO., LTD., Nagaokakyo (JP)

(72) Inventor: Kimmo Kaija, Espoo (FI)

(73) Assignee: Murata Manufacturing Co., Ltd., Nagaokakyo (JP)

(*) Notice: Subject to any disclaimer, the term of this patent is extended or adjusted under 35 U.S.C. 154(b) by 134 days.

(21) Appl. No.: 17/401,918

(22) Filed: Aug. 13, 2021

(65) Prior Publication Data
US 2022/0110213 A1  Apr. 7, 2022

(30) Foreign Application Priority Data
Oct. 7, 2020 (FI) .................................... 20205984

(51) Int. Cl.
*H05K 3/24* (2006.01)
*H05K 1/18* (2006.01)
*H05K 3/00* (2006.01)

(52) U.S. Cl.
CPC ........... *H05K 1/181* (2013.01); *H05K 3/0014* (2013.01); *H05K 3/24* (2013.01); *H05K 2201/09118* (2013.01); *H05K 2201/2018* (2013.01)

(58) Field of Classification Search
CPC ........... H05K 3/24; H05K 2201/09118; H05K 2201/2018
See application file for complete search history.

(56) References Cited

U.S. PATENT DOCUMENTS

| 5,157,480 A | 10/1992 | McShane et al. |
| 6,265,761 B1* | 7/2001 | Ghai ................. H01L 23/49503 257/676 |
| 6,303,985 B1* | 10/2001 | Larson .............. H01L 23/49503 257/676 |
| 6,818,973 B1 | 11/2004 | Foster |
| 2008/0157311 A1 | 7/2008 | Smith |

(Continued)

FOREIGN PATENT DOCUMENTS

| EP | 1863086 A2 | 12/2007 |
| FI | 20185187 A1 | 8/2019 |

(Continued)

OTHER PUBLICATIONS

Finnish Search Report dated Mar. 15, 2021 corresponding to Finnish Patent Application No. 20205984.

(Continued)

*Primary Examiner* — Sherman Ng
(74) *Attorney, Agent, or Firm* — Squire Patton Boggs (US) LLP

(57) ABSTRACT

This disclosure describes an electronic component with a package body which comprises a set of sidewalls and a bottom wall. One or more chip mounting elements extend into the space within the package from the inner surface of at least one sidewall, and at least one electronic chip is attached to the chip mounting elements. The electronic component also comprises one or more stiffening elements which extend inside the space within the package from the inner surface of one of the sidewalls to the outer surface of the bottom wall. These stiffening elements are separated from the one or more chip mounting elements inside the enclosed inner space.

6 Claims, 4 Drawing Sheets

(56) References Cited

U.S. PATENT DOCUMENTS

2013/0128487 A1    5/2013  Lo et al.
2014/0306333 A1   10/2014  Fan
2019/0386206 A1   12/2019  Schaller et al.

FOREIGN PATENT DOCUMENTS

FI         128 296 B      2/2020
JP       H06 252279 A     9/1994
JP        2014183242 A    9/2014

OTHER PUBLICATIONS

European Search Report dated Feb. 28, 2022 corresponding to European Patent Application No. 21195505.
Office Action dated Sep. 6, 2022, corresponding to Japanese Patent Application No. 2021-140676.

* cited by examiner

MECHANICAL SUPPORT WITHIN MOULDED CHIP PACKAGE

FIELD OF THE DISCLOSURE

This disclosure relates to packages for electronic chips, and more particularly to plastic packages formed around electronic components by moulding. The present disclosure further concerns the mechanical properties of such packages.

BACKGROUND OF THE DISCLOSURE

Electronic chips, which may also be called dies, are usually prepared by manufacturing various electronic structures on a substrate and cutting the substrate into small, chip-size pieces. Each chip can then be placed inside a protective package which forms an enclosure where the chip is protected from the surrounding environment. The chip can be mechanically attached to a support structure inside the enclosure, such as a die pad, and electrically connected to contacts which extend outside of the enclosure. The packaged chip thereby forms an electronic component which can be mounted on a circuit board.

One method for manufacturing a packaged electronic chip is to mould the package onto a leadframe structure formed from a malleable planar sheet. The leadframe can be patterned by etching or stamping so that it contains dedicated mounting elements where one or more chips can be mechanically attached, which may include dedicated contact elements to which these chips can be electrically connected. When the chips have been attached and connected, two halves of a plastic package can be moulded onto opposite sides of the leadframe structure so that the chips are enclosed inside the package walls.

The mounting elements formed from the leadframe structure can have different shapes.

Document U.S. Pat. No. 6,818,973 discloses an electrical component where a leadframe has been used to form mounting elements for an electronic chip. This arrangement can be problematic in applications where the electrical component is exposed to external vibration, because the protective package may resonate at a frequency which influences the operation of the component.

The leadframe may be used to build structures which extend from the chip mounting elements to the bottom of the package. However, this may produce tilting in the chip-mounting elements when the package is moulded. Even a small tilt in the chip mounting elements can significantly impair the functioning of orientation-sensitive chips.

Document U.S. Pat. No. 5,157,480 discloses an electrical component where a leadframe has been used to form mounting elements for an electronic chip. Electrical leads manufactured from the leadframe form double contacts which extend out of the package both on the sidewall and on the bottom. A problem with this use of the leadframe is that the contacts consume so much space that the size of the package may have to be increased to accommodate them all.

BRIEF DESCRIPTION OF THE DISCLOSURE

An object of the present disclosure is to provide an apparatus for alleviating the above disadvantages.

The object of the disclosure is achieved by an arrangement which is characterized by what is stated in the independent claim. The preferred embodiments of the disclosure are disclosed in the dependent claims.

The disclosure is based on the idea of building stiffening elements inside the package of an electronic component. These stiffening elements are independent of any support elements or contact elements inside the package. Their number, location and mechanical properties can be freely selected. An advantage of this arrangement is that the resonance properties of the package can be adjusted without influencing the operation of the electronic chip or the size of its package.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

This disclosure describes an electronic component comprising a package body which comprises a set of sidewalls and a bottom wall which shares a common edge with each sidewall in the set of sidewalls. The bottom wall and the sidewalls delimit an enclosed inner space, and each sidewall and the bottom wall have an inner surface and an outer surface. One or more chip mounting elements extend into the enclosed inner space from the inner surface of at least one sidewall. At least one electronic chip is attached to the one or more chip mounting elements inside the enclosed inner space. The electronic component also comprises one or more stiffening elements which extend inside the enclosed inner space from the inner surface of one of the sidewalls to the outer surface of the bottom wall. Said one or more stiffening elements are separated from the one or more chip mounting elements inside the enclosed inner space.

The chip mounting elements may comprise support elements which provide mechanical support to the chip and contact elements which facilitate electrical connections to the chip. The contact elements may extend out of the package to facilitate connection to an external electric circuit. The electronic chip may be attached to the support elements for example with an adhesive. The electronic chip may be attached to contact elements for example with electric wires.

The fact that the one or more stiffening elements are separated from the one or more chip mounting elements inside the enclosed inner space means that there is a nonzero distance between each stiffening element and each chip mounting element, and that no structural element extends from any chip mounting element to any stiffening element.

In the figures of this disclosure, the plane defined by the x- and y-axes is parallel to the plane of a circuit board to which the electronic component will be attached. The direction defined by the z-axis is perpendicular to the same circuit board plane.

The words "bottom" and "top" refer here only to how the component is intended to be placed onto the circuit board. The bottom side of the component is intended to be attached to the surface of the circuit board. Words such as "bottom" and "top" do not refer to the orientation of the component with regard to the direction of earth's gravitational field either when the component is manufactured or when it is in use, although they can be in agreement with this conventional meaning of top/bottom when the xy-plane is horizontal.

Figure 1:
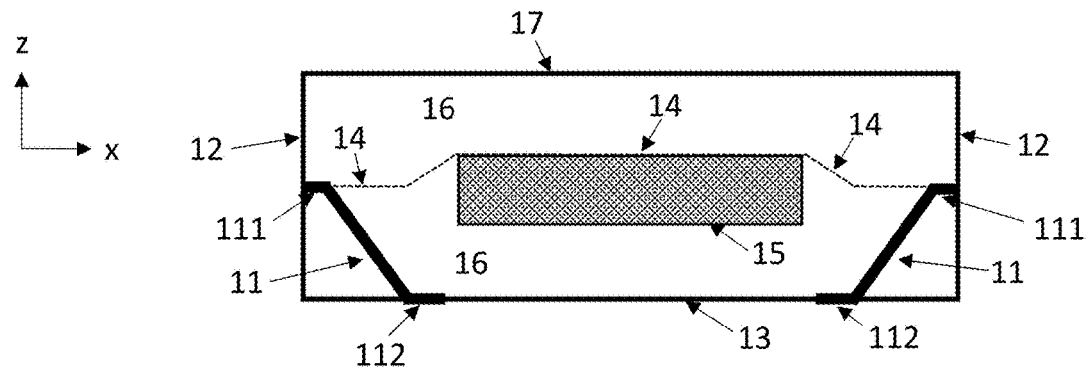
FIG. 1 illustrates a cross-section of an electronic component.

FIG. 1 illustrates schematically a cross-section of an electronic component. The component comprises a package body which includes a set of sidewalls 12, a bottom wall 13 and a top wall 17. These walls delimit an enclosed inner space 16. The sidewalls, the bottom wall and the top wall may be formed in a moulding process, as described in more detail below.

The electronic component also comprises a chip mounting element 14. An electronic chip 15 is attached to the chip mounting element 14 for example with an adhesive. The chip mounting element is here a support element. Contact elements are not illustrated in FIG. 1. The component also comprises stiffening elements 11 which extend from the sidewalls 12 to the bottom wall 13. A first end 111 of each stiffening element 11 is attached to the corresponding sidewall 12, and a second end 112 of each stiffening element 11 is attached to the bottom wall 13.

In FIG. 1 the first end 111 of each stiffening element 11 is level with the chip mounting element 14 at the corresponding sidewall 12. In other words, the first end 111 and the end of the mounting element 14 which is attached to the sidewall 12 have the same z-coordinate. However, they have a different y-coordinate (perpendicular to the illustrated xz-plane) so that they are not in direct mechanical contact with each other.

The electronic component may be formed in a method which comprises a step where a packaging pattern is patterned on an essentially planar sheet of metal. The sheet of metal defines a reference plane and the packaging pattern defines a patterned area on the sheet of metal. The packaging pattern comprises a stiffening element pattern and a mounting element pattern inside the patterned area. The stiffening element pattern is not in direct mechanical contact with the mounting element pattern inside the patterned area.

The method also comprises the step of bending at least a part of the stiffening element pattern out of the reference plane to form one or more stiffening elements, whereby each of the one or more stiffening elements comprises a first end which is attached to the sheet of metal in the reference plane and a second end which does not lie in the reference plane.

The method also comprises the step of moulding a plastic package body over the patterned area, wherein the package body comprises a set of sidewalls and a bottom wall which shares a common edge with each sidewall in the set of sidewalls, so that the second end of each of the one or more stiffening elements is attached to the bottom wall.

The mounting element pattern may include a support element pattern which forms elements which provide mechanical support to the chip and a contact element pattern which forms contact elements which facilitate electrical connections to the chip.

The planar sheet of metal may form a leadframe. It may for example be made of malleable material such as copper. The packaging pattern, which comprises the mounting element pattern and stiffening element pattern, may be formed on the leadframe for example by etching or stamping. Selected parts of the packaging pattern may then be vertically offset from the reference plane in either direction with a downset tool which pushes and bends them out of the reference plane.

Figure 2:
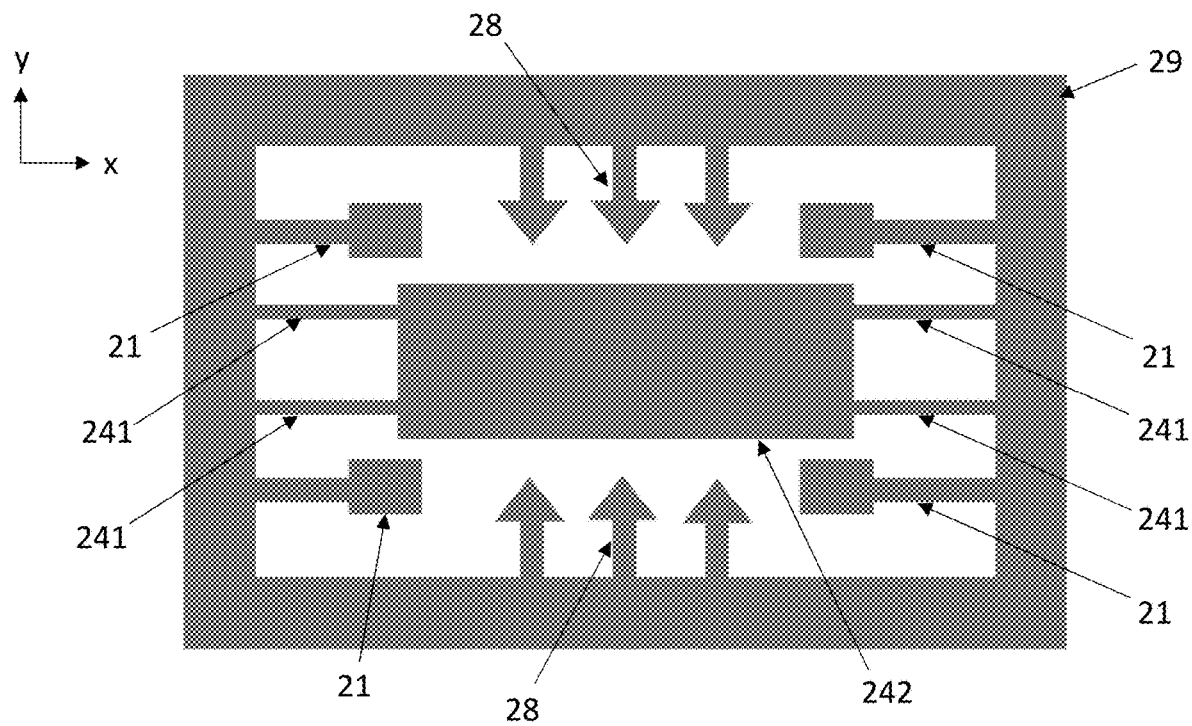
FIG. 2 illustrates a leadframe with a patterned area.

FIG. 2 illustrates schematically a leadframe 29 with a patterned area in the center. The patterned area comprises a packaging pattern with two sets of patterns which extend inward from the unpatterned carrier area of the leadframe. The first pattern set is the stiffening element pattern 21, the second is the mounting element pattern which in this case comprises support elements which include tie bars 241 and a die pad 242 and contact elements 28. The mounting element pattern could alternatively comprise any other support elements which can form a support for an electronic chip. The contact elements 28 may be omitted if electrical connections to the electronic chip can be manufactured in other ways. However, many chips require a greater number of contact elements than the six which are schematically illustrated in FIG. 2. The number of contact elements needed to make all the required electrical connections may be greater than 10 or even greater than 20.

As FIG. 2 illustrates, the stiffening elements 21 may be arranged on a side of the enclosed inner space where no contact element 28 is present. The stiffening elements 21 may also be arranged on two opposing sides of the enclosed inner space, so that no contact element 28 is present on either one of these two opposing sides. Any part of the stiffening elements 21 may be wider (in the y-direction in FIG. 2) than the width (in the x-direction in FIG. 2) of any part of the contact elements 28. Any part of the stiffening elements 21 may be wider than the widest part of any contact element 28.

Figure 3:
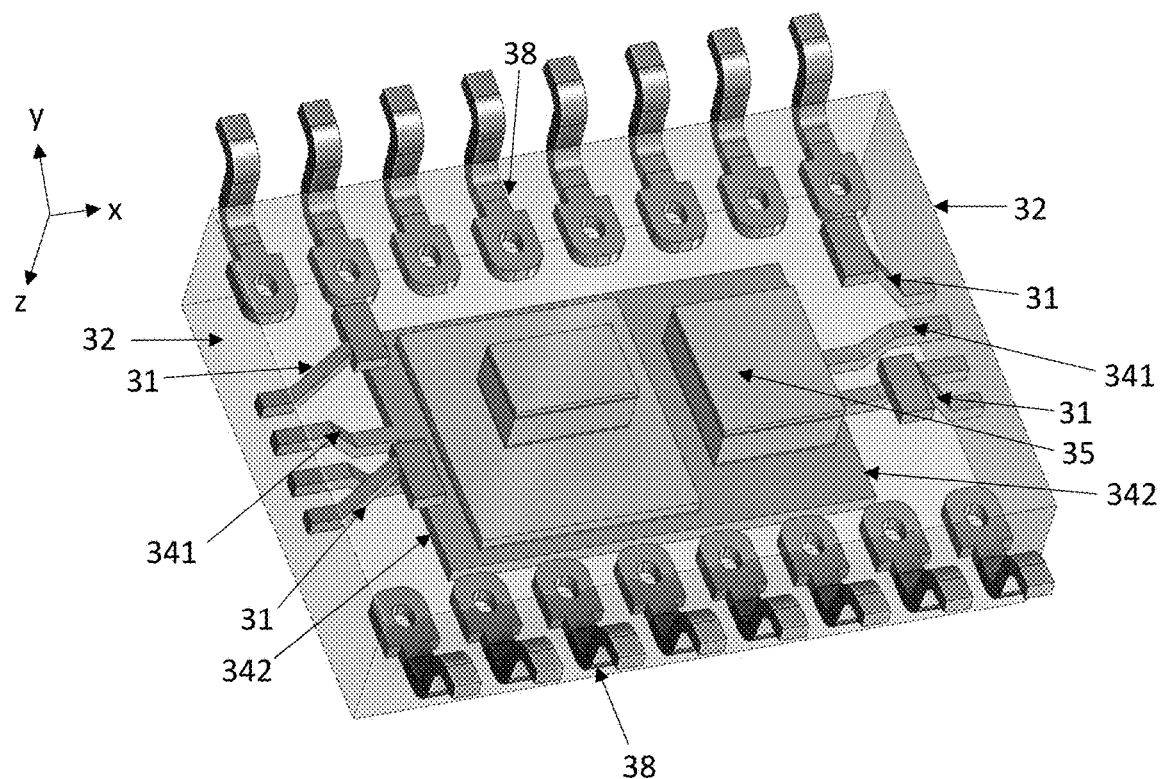
FIG. 3 also illustrates a leadframe.

FIG. 3 illustrates a more realistic leadframe configuration three-dimensionally. Reference numbers 31, 341-342 and 38 correspond to reference numbers 21, 241-242 and 28, respectively, in FIG. 2. The packaging pattern has here been covered from both sides by an overmoulded plastic package body and then released from the carrier area of the leadframe (which is not illustrated). Electronic chips 35 have been attached to the die pad 342. The enclosed inner space inside the package body is illustrated by the shaded volume. The stiffening elements 31 extend from the sidewalls 32 of the package body to the bottom wall of the package body. The stiffening elements 31 are not in direct mechanical contact with the chip mounting elements 341-342 and 38 inside the enclosed inner space 32.

The one or more stiffening elements may comprise P stiffening elements, where P is an integer. P may for example be 1, 2, 3, 4, or it may lie within the ranges 1-20, 1-10, 1-5, 1-4, 2-10, 1-8, 2-4 or 2-5. The number of contact elements which are formed from the leadframe and extend out of the package may be an integer Q. As mentioned above Q may be greater than 10 or greater than 20. P may be less than Q. These options apply to any embodiment presented in this disclosure.

The set of sidewalls may consist of four sidewalls which together with the bottom wall give the enclosed inner space substantially the shape of a cuboid. The one or more stiffening elements may comprise N stiffening elements which extend from the inner surface of a first sidewall in the set of sidewalls to the outer surface of the bottom wall and N stiffening elements which extend from the inner surface of a second sidewall in the set of sidewalls to the outer surface of the bottom wall. N is an integer and the first and second sidewalls are opposite to each other in the cuboid. N may for example be 1, 2, 3, 4 or it may lie within one of the ranges 1-20, 1-10, 1-5, 2-10, 1-8, 2-4 or 2-5. If symmetry is not essential, the number of stiffening elements which extend inside the enclosed inner space from the inner surface of the first sidewall could be N, and the number of stiffening elements which extend inside the enclosed inner space from the second sidewall could be an integer which differs from N but still lies within one of the ranges mentioned above. The number of contact elements which are formed from the leadframe and extend out of the package on the first or second sidewall may be an integer Q1. N may be less than Q1. These options apply to any embodiment presented in this disclosure.

The electrical component may be an inverted component. In other words, when the bottom of the component is attached to the surface of a printed circuit board, the chip 35 may be closer to the bottom than the mounting element to which the chip 35 is fixed (in this case the die pad 342). FIG. 3 then shows the component from its bottom side. The same inverted configuration was already illustrated in FIG. 1. The electrical component may alternatively have a regular configuration where the mounting element to which the chip is fixed is closer to the bottom than the chip. This alternative has not been separately illustrated.

In other words, the chip mounting elements may comprise a die pad to which the electronic chip is attached, and the electronic chip may be mounted upside down within the package body, so that the electronic chip is closer to the bottom wall than the die pad.

Figure 4A:
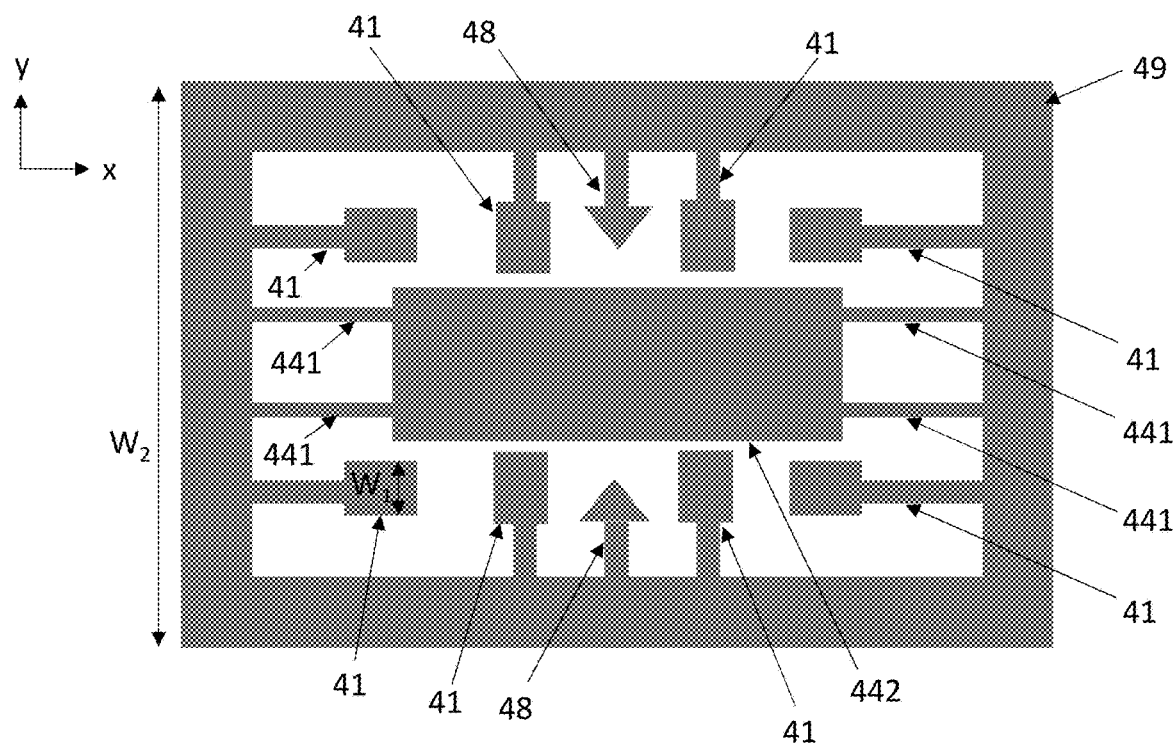
FIGS. 4a and 4b illustrate leadframes with a packaging pattern.

The number and placement of stiffening elements is freely selectable within the constraints set by the mounting element pattern. FIG. 4a illustrates an alternative mounting element pattern where reference numbers 41, 441-442, 48 and 49 correspond to reference numbers 21, 241-242, 28 and 29, respectively, in FIG. 2. Here the number of contact elements 48 has been reduced, and as a result, stiffening elements can be implemented on all four sides of the packaging pattern.

After the packaging pattern illustrated in FIG. 4a has been overmoulded and released from the leadframe carrier, the one or more stiffening elements will comprise, in addition to the N stiffening elements attached to the first and second sidewall in the cuboid-shaped inner space as specified above, M stiffening elements which extend from the inner surface of a third sidewall in the set of sidewalls to the outer surface of the bottom wall and M stiffening elements which extend from the inner surface of a fourth sidewall in the set of sidewalls to the outer surface of the bottom wall. M is an integer and the third and fourth sidewalls are opposite to each other in the cuboid. Again, if symmetry is not essential, the number of stiffening elements which extend inside the enclosed inner space from the inner surface of the fourth sidewall can be an integer which differs from M. M may for example be 1, 2 or it may lie within one of the ranges 1-20, 1-10, 1-5, 2-10, 1-8, 2-4 or 2-5. The number of contact elements which are formed from the leadframe and extend out of the package on the third or fourth sidewall may be an integer Q2. M may be less than Q2.

Additional stiffness can be given to the component package in some applications by connecting stiffening bars to each other along the bottom wall of the package body. For example, at least one of the N stiffening elements which extend inside the enclosed inner space from the inner surface of the first sidewall may be connected to at least one of the N stiffening elements which extend inside the enclosed inner space from the inner surface of the second sidewall by a connecting stiffening bar which extends along the outer surface of the bottom wall.

Figure 4B:
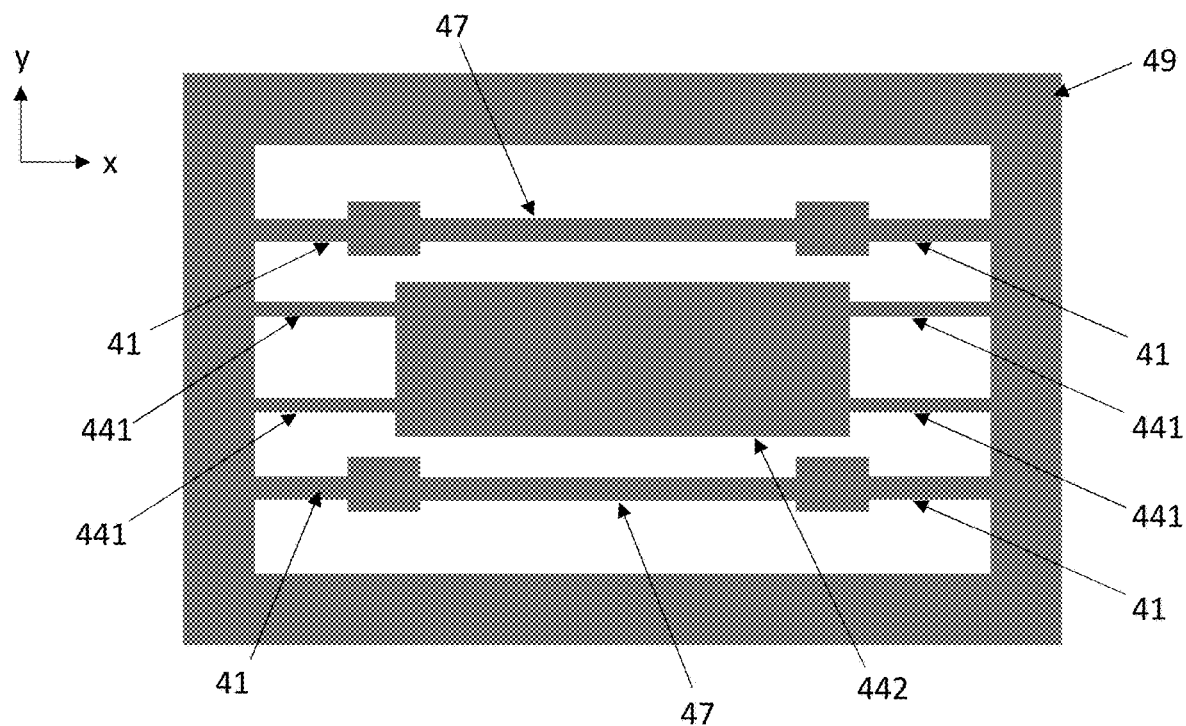

FIG. 4b illustrates a packaging pattern where the stiffening elements 41 on the left and right sides of the figure are connected to each other by a connecting stiffening bar 47. When the stiffening elements 41 and the connecting stiffening bar 47 are pushed out of the xy-plane in the next step of the manufacturing process and then overmoulded by the package body, the connecting stiffening bar 47 may extend along the bottom wall of the electrical component. The embodiments illustrated in FIGS. 4a and 4b can be combined with each other.

Figure 5:
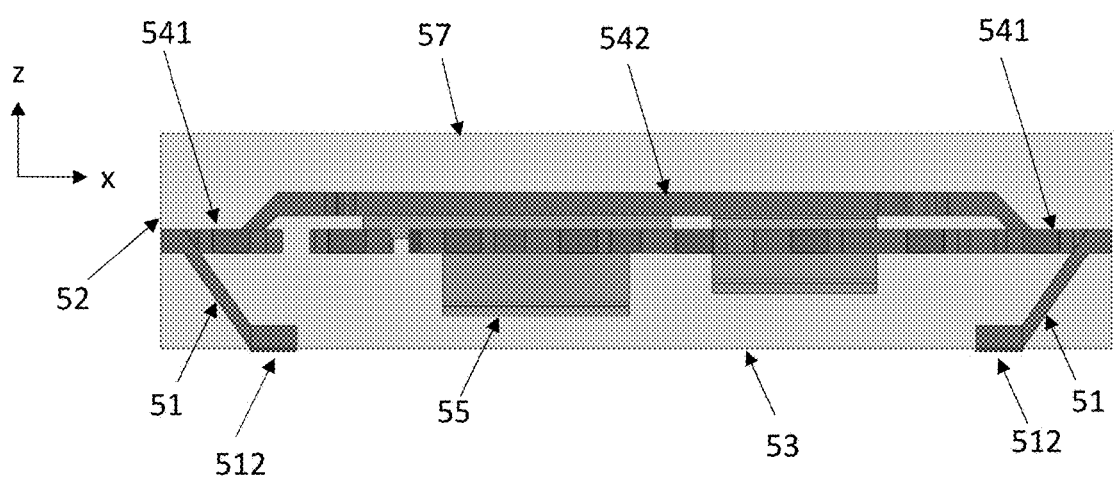
FIG. 5 illustrates an electronic component.

FIG. 5 illustrates an electronic component where reference numbers 51, 541-542 and 55 correspond to reference numbers 31, 341-342 and 35, respectively, in FIG. 3. As in FIG. 1 the component comprises a package body which includes a set of sidewalls 52, a bottom wall 53 and a top wall 57. The component also comprises stiffening elements 51 which extend from the sidewalls 52 to the bottom wall 53. A second end 512 of each stiffening element 51 is attached to the bottom wall 53 and extends through the bottom wall. The second ends 512 form attachments regions which can be attached to an underlying circuit board for example by soldering. The attachment region may be coated before attachment, for example with a layer of tin.

The second ends 512 of the stiffening elements 51 may be exposed on the bottom wall by bringing the package body mould exactly to the level of these second ends when the package is moulded. If they are still covered by a thin layer of plastic after the moulding process, deflash methods, laser cleaning and/or polishing methods may be used to expose the second ends 512 sufficiently.

Figure 6:
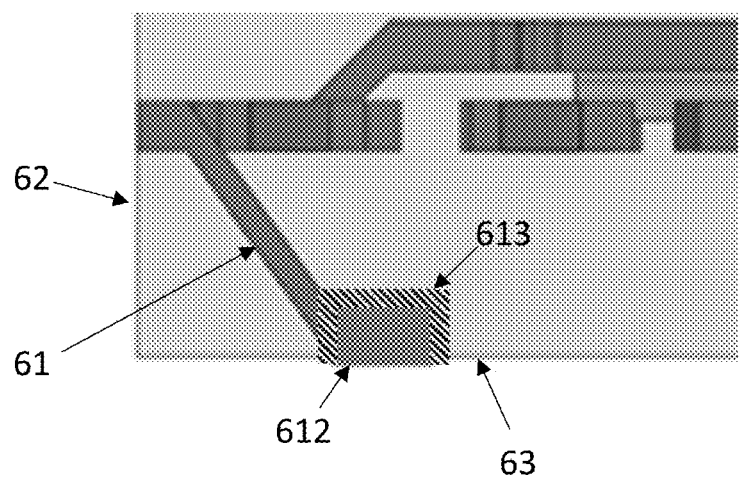
FIG. 6 illustrates another example of an electronic component.

FIG. 6 illustrates an electronic component where reference numbers 61, 62, 63 and 612 correspond to reference numbers 61, 62, 63 and 612, respectively, in FIG. 5. The component differs from the one illustrated in figure in that the second end 612 of each stiffening element is partly surrounded by a layer of elastic interface material 613 which lies between the stiffening element and the bottom 63 of the package. The durability of the mechanical contact between the second end 612 of a stiffening element and a circuit board may in some applications be improved by the interface material 613.

The interface material 613 may be any material which can be attached to the second end 612 of a stiffening element and which is more elastic than the material of the package body. The interface material 613 may be applied to a stiffening element before the package is moulded onto the leadframe. The interface material 613 may initially surround the second end 612 of a stiffening element on all sides. After the package has been moulded, the interface material 613 may be removed from the bottom of the second end 612 so that this second end can be attached directly to a circuit board.

In any embodiment presented in this disclosure, the width L1 of the one or more stiffening elements along the bottom wall in the direction of the corresponding sidewall may be greater than 5%, 10%, 20%, 30% or 40% of the width L2 of said sidewall. These widths are illustrated in FIG. 4a. The corresponding sidewall is in this case the sidewall to which the first end of the stiffening element is attached.

The invention claimed is:

1. An electronic component comprising a package body which comprises a set of sidewalls and a bottom wall which shares a common edge with each sidewall in the set of sidewalls, wherein the bottom wall and the sidewalls delimit an enclosed inner space, and each sidewall and the bottom wall have an inner surface and an outer surface, and one or more chip mounting elements extend into the enclosed inner space from the inner surface of at least one sidewall, and at least one electronic chip is attached to the one or more chip mounting elements inside the enclosed inner space, wherein the electronic component comprises one or more stiffening elements which extend inside the enclosed inner space from the inner surface of one of the sidewalls to the outer surface of the bottom wall, and said one or more stiffening elements are separated from the one or more chip mounting elements inside the enclosed inner space.

2. The electronic component according to claim 1, wherein the set of sidewalls comprises four sidewalls which together with the bottom wall give the enclosed inner space substantially the shape of a cuboid, and the one or more stiffening elements comprise N stiffening elements which extend from the inner surface of a first sidewall in the set of sidewalls to the outer surface of the bottom wall, N stiffening elements which extend from the inner surface of a second sidewall in the set of sidewalls to the outer surface of the bottom wall, where N is an integer and the first and second sidewalls are opposite to each other in the cuboid.

3. The electronic component according to claim 2, wherein the one or more stiffening elements further comprise M stiffening elements which extend from the inner surface of a third sidewall in the set of sidewalls to the outer surface of the bottom wall, M stiffening elements which extend from the inner surface of a fourth sidewall in the set of sidewalls to the outer surface of the bottom wall, where M is an integer and the third and fourth sidewalls are opposite to each other in the cuboid.

4. The electronic component according to claim 2, wherein at least one of the N stiffening elements which extend inside the enclosed inner space from the inner surface of the first sidewall is connected to at least one of the N stiffening elements which extend inside the enclosed inner space from the inner surface of the second sidewall by a connecting stiffening bar which extends along the outer surface of the bottom wall.

5. The electronic component according to claim 1, wherein the width of the one or more stiffening elements along the bottom wall in the direction of the corresponding sidewall is greater than 5% of the width of said sidewall.

6. The electronic component according to claim 1, wherein the chip mounting elements comprise a die pad to which the electronic chip is attached, and the electronic chip is mounted upside down within the package body, so that the electronic chip is closer to the bottom wall than the die pad.

* * * * *